(12) United States Patent
Katagiri

(10) Patent No.: US 7,932,602 B2
(45) Date of Patent: Apr. 26, 2011

(54) METAL SEALED WAFER LEVEL CSP

(75) Inventor: Haruyoshi Katagiri, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/147,578

(22) Filed: Jun. 27, 2008

(65) Prior Publication Data
US 2009/0039471 A1 Feb. 12, 2009

(30) Foreign Application Priority Data
Aug. 6, 2007 (JP) ................... 2007-204355

(51) Int. Cl.
H01L 23/48 (2006.01)
H01L 23/52 (2006.01)
H01L 29/40 (2006.01)

(52) U.S. Cl. ............... 257/758; 257/620; 257/E23.169

(58) Field of Classification Search .............. 257/758, 257/778, 730, 731, 678, 782, 786, E23.169, 257/E23.174, E23.175, E23.178
See application file for complete search history.

(56) References Cited

U.S. PATENT DOCUMENTS

| | | | |
|---|---|---|---|
| 2005/0164490 A1* | 7/2005 | Morrow et al. | 438/629 |
| 2006/0145347 A1* | 7/2006 | Aida | 257/758 |
| 2006/0255465 A1* | 11/2006 | Kishiro | 257/758 |

FOREIGN PATENT DOCUMENTS

| | | |
|---|---|---|
| JP | 2002-359257 | 12/2002 |
| JP | 2009-43779 | 2/2009 |

\* cited by examiner

*Primary Examiner* — A. Sefer
*Assistant Examiner* — Dilinh P Nguyen
(74) *Attorney, Agent, or Firm* — Taft Stettinius & Hollister LLP

(57) ABSTRACT

A semiconductor device comprising: (a) a semiconductor substrate having a dicing region circumscribing a chip region, the chip region including a central region and a peripheral region around the central region; (b) an active electrical structure formed to extend from a first main surface to a second surface vertically spaced apart from the last main surface in the central region of the semiconductor substrate; (c) a through dummy isolation structure formed within the peripheral region to extend from the first main surface of the semiconductor substrate to a third surface vertically spaced apart from the first main surface of the semiconductor substrate, the through dummy isolation structure surrounding the active electrical structure; (d) an insulating layer disbursed throughout the active electrical structure within the central region and around the through dummy isolation structure of the peripheral region, the insulating layer including top and opposed peripheral sides; and (e) a metal film located over the top and peripheral sides of the wiring insulating film and over the semiconductor substrate.

8 Claims, 11 Drawing Sheets

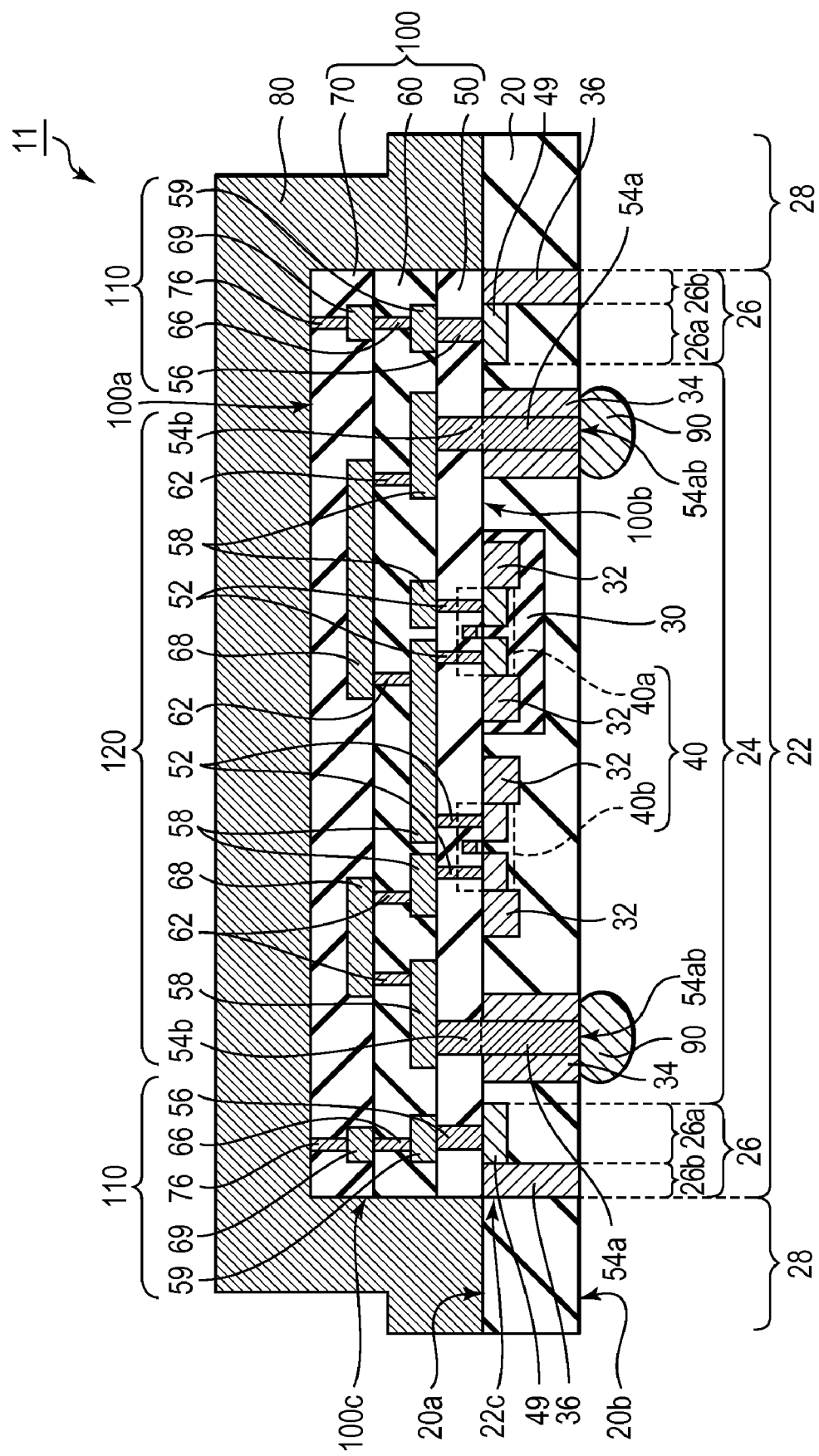

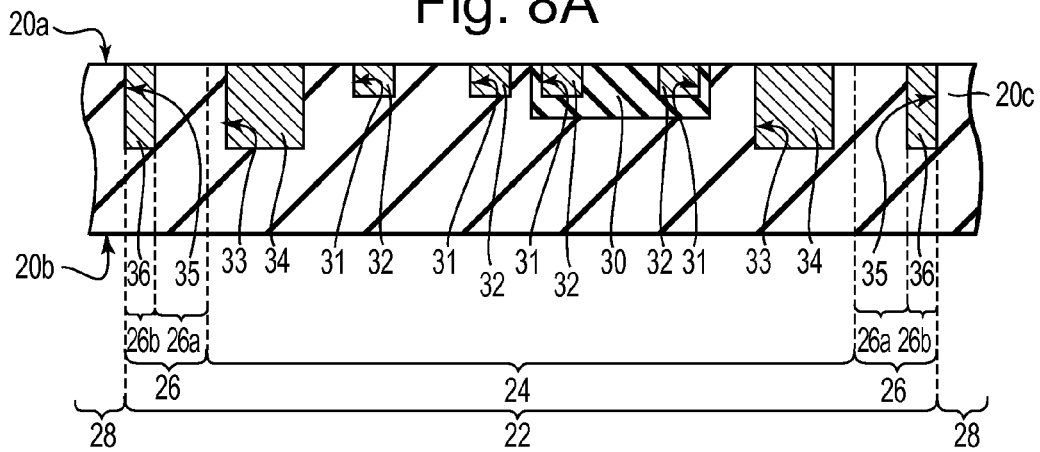
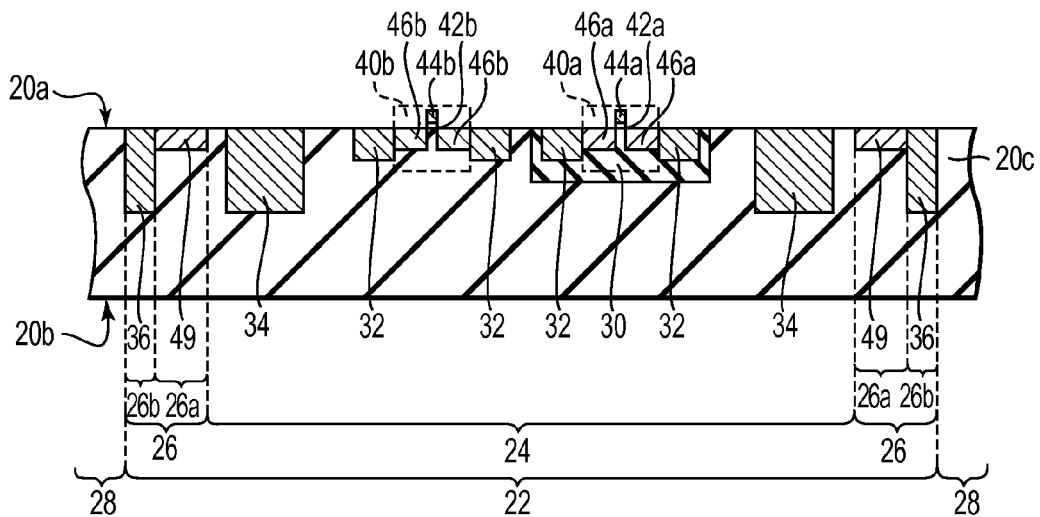
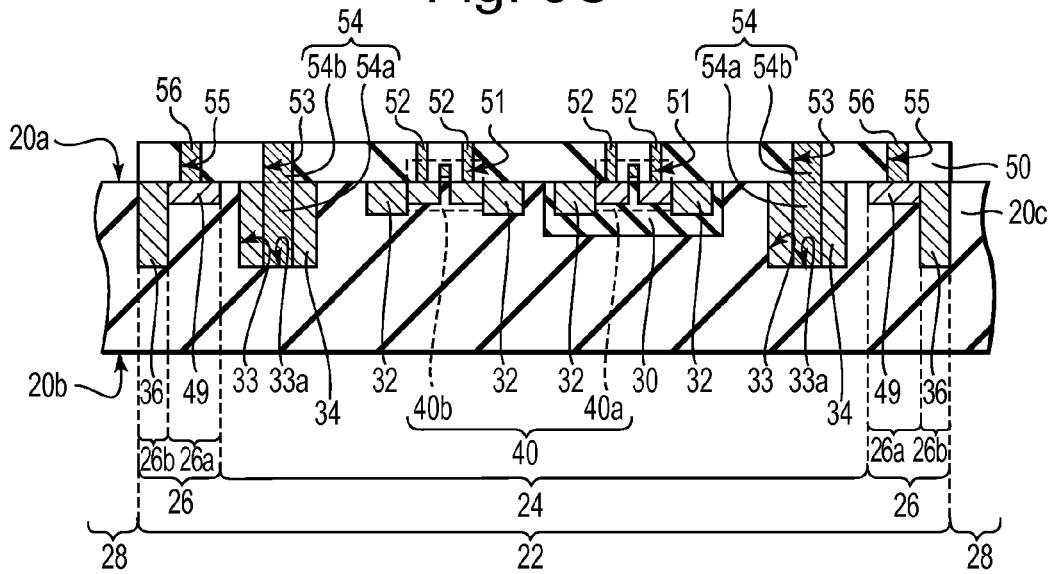

METAL SEALED WAFER LEVEL CSP

CROSS-REFERENCE TO RELATED APPLICATIONS

This application is a claims priority under 35 U.S.C. §119 to Japanese Patent Application Serial No. JP2007-204355 filed on Aug. 6, 2007, entitled "SEMICONDUCTOR DEVICE AND METHOD OF MANUFACTURING THE SAME," the disclosure of which is hereby incorporated by reference.

RELATED ART

1. Field of the Invention

The present invention relates to a semiconductor device and a method of manufacturing the same and, more particularly, to a metal-sealed wafer level chip size package (CSP) and a method of manufacturing the same.

2. Brief Discussion of Related Art

Conventional wafer level CSPs use a resin insulating film made of polyimide, benzocyclobutene (BCB), or the like to seal multi-layered wirings formed on a semiconductor substrate. However, since polyimide has high absorptiveness, saturated water may penetrate into the CSPs. Although BCB has low absorptiveness, water may permeate into an interface between metal and BCB or into BCB itself. Permeating water tends to corrode multi-layered wirings. Due to such a water-proof problem, CSPs sealed by these resin insulating films cannot be used in fields requiring high reliability.

To enhance waterproofing, there has been proposed a semiconductor device in which a resin insulating film is covered with a metal film formed on the top and sides of the resin insulating film (for example, see Japanese Unexamined Patent Application Publication No. 2002-359257). However, although the resin insulating film is covered by the metal film, water may still penetrate into the semiconductor device through an interface between the metal film and a semiconductor substrate.

In addition, it is required to provide through electrodes in the semiconductor substrate and connection terminals to the external in a rear side of the semiconductor substrate in order to electrically connect elements formed on a front side of the semiconductor substrate to an external circuit. Here, if a silicon substrate is used as the semiconductor substrate, isolation of the through electrodes from their neighboring elements is required. However, if the silicon substrate is thick, it is difficult to form the through electrodes and an isolation film to isolate the through electrodes from their neighboring elements. This is because a thick substrate has a high aspect ratio, which is likely to result in defective filling. On the other hand, if the silicon substrate is thin, its mechanical strength is weak, which may make it difficult to handle.

INTRODUCTION TO THE INVENTION

The instant invention provides a semiconductor device which is capable of preventing water from penetrating into the semiconductor device through an interface between a metal film and a silicon substrate. Thus, the present invention is operative to prevent adverse effects associated from water penetration, such as corroding internal multi-layered wirings, by forming ambient wirings to surround a chip.

A semiconductor substrate has a dicing region and a chip region partitioned by the dicing region. The chip region includes a central region and a peripheral region around the central region. An element is formed in the central region at a side of a first main surface which is one of main surfaces of the semiconductor substrate. A through isolation structure is formed in the central region of the semiconductor substrate, extending from the first main surface to a second main surface opposing the first main surface. A through electrode is then formed in the through isolation part, extending from the first main surface to the second main surface. Thereafter, a wiring insulating film is formed on the first main surface of the semiconductor substrate. A chip wiring is formed on the wiring insulating film in the central region, and a peripheral wiring is formed on the wiring insulating film in the peripheral region, surrounding the central region. A metal film is then formed on the top and lateral sides of the wiring insulating film.

In summary fashion, an exemplary method of manufacturing a semiconductor device in accordance with the instant invention includes preparing a semiconductor device having a plurality of chip regions each including a central region and a peripheral region around the central region. Next, a through isolation groove is formed in the central region of the semiconductor substrate, extending from a first main surface, which is one of main surfaces of the semiconductor substrate, to a second main surface opposing the first main surface. Then, a through isolation structure is formed by filling the through isolation groove with an oxide film. Thereafter, an element is formed in the central region at a side of the first main surface of the semiconductor substrate. Subsequently, a wiring insulating film, a peripheral wiring, and a chip wring are formed on the first main surface of the semiconductor substrate, and a through electrode is formed in the through isolation structure. The peripheral wiring is formed on the, wiring insulating film in the peripheral region, extending from the upper side to the lower side of the wiring insulating film and surrounding the central region. The chip wiring is formed in the central region of the wiring insulating film. Next, a metal film is formed in the top and lateral sides of the wiring insulating film. Then, the semiconductor substrate is thinned on the second main surface until the through electrode is exposed.

The instant invention provides many advantages over the prior art. For example, the semiconductor device provides improved waterproofing as a result of the peripheral wiring surrounding the chip wiring. Also, since the peripheral wiring may be formed at the same time as the internal chip wiring, it is possible to provide a semiconductor device with improved waterproof without increasing the number of process steps. In addition, the metal film formed as the protection film can be used as a support. Since this metal film maintains its mechanical strength and facilitates handling in a mounting process, it is practical to thin the semiconductor substrate. Thus, the through isolation structure and the through electrode may be exposed to the second main surface when the semiconductor substrate is thinned later, and it is possible to form the through isolation structure and the through electrode with a low aspect ratio. As a result, filling defects of the through electrode and the through isolation structure may be reduced.

It is a first aspect of the present invention to provide a semiconductor device comprising: (a) a semiconductor substrate having a dicing region circumscribing a chip region, the chip region including a central region and a peripheral region around the central region; (b) an active electrical structure formed to extend from a first main surface to a second surface vertically spaced apart from the first main surface in the central region of the semiconductor substrate; (c) a through dummy isolation structure formed within the peripheral region to extend from the first main surface of the semiconductor substrate to a third surface vertically spaced apart from the first main surface of the semiconductor substrate, the through dummy isolation structure surrounding the active electrical structure; (d) an insulating layer disbursed throughout the active electrical structure within the central region and around the through dummy isolation structure of the peripheral region, the insulating layer including top and opposed peripheral sides; and (e) a metal film located over the top and peripheral sides of the wiring insulating film and over the semiconductor substrate.

In a more detailed embodiment of the first aspect, the invention further comprises an impurity diffusing layer formed within the semiconductor substrate in the peripheral region, where the through dummy isolation structure contacts the impurity diffusing layer. In yet another more detailed embodiment, a peripheral oxide film formed within the semiconductor substrate surrounds the central region, the peripheral oxide film extending from the first main surface to a second main surface of the semiconductor device. In a further detailed embodiment, the peripheral region includes a first region adjacent to the central region and a second region surrounding the first region, the invention further comprises an impurity diffusing layer formed within the semiconductor substrate in the first region, where the through dummy isolation structure contacts the impurity diffusing layer, and where a peripheral oxide film is formed within the semiconductor substrate in the second region, the peripheral oxide film extending from the first main surface to a second main surface of the semiconductor device. In still a further detailed embodiment, the invention further includes a peripheral through electrode formed in the peripheral oxide film, the peripheral through electrode extending from the first main surface to the second main surface, where the through dummy isolation structure contacts the peripheral through electrode. In a more detailed embodiment, the thickness of the semiconductor substrate is no greater than 10 µm.

In yet another more detailed embodiment of the first aspect, the invention further includes a rear side insulating film formed on a second main surface of the semiconductor device, opposite the first main surface, an external terminal in contact with an electrode extending through the semiconductor substrate and in contact with the active electrical structure, and a rear side wiring formed in the central region of the rear side insulating film and electrically connecting the external terminal to an electrode extending through the semiconductor substrate and in contact with the active electrical structure. In still another more detailed embodiment, the invention further includes a rear side insulating film formed over a second main surface of the semiconductor device, opposite the first, main surface, and an external terminal in contact with an electrode extending through the semiconductor substrate and in contact with the active electrical structure.

It is a second aspect of the present invention to provide a method of manufacturing a semiconductor device, comprising the steps of: (a) forming a wiring insulating layer within a central region and a peripheral region of a semiconductor substrate, the wiring insulating layer including top and opposed peripheral sides; (b) forming an active electrical structure over the semiconductor substrate and within the central region, the active electrical structure extending between the semiconductor substrate to a first surface vertically spaced apart from the semiconductor substrate; (c) forming a through dummy isolation structure over the semiconductor substrate and within a peripheral region circumscribing the central region of the semiconductor substrate, the through dummy isolation structure circumscribing the active electrical structure, and the through dummy isolation structure continuously extending between a surface of the semiconductor substrate to a second surface vertically spaced apart from the semiconductor substrate, and (d) forming a metal film over the top and peripheral sides of the wiring insulating layer, the metal film contacting an exposed portion of the dummy isolation structure at the second surface, where the wiring insulating layer is disbursed throughout the active electrical structure within the central region and around the through dummy isolation structure within the peripheral region, and where the formation of the active electrical structure occurs concurrently with the formation of the dummy isolation structure.

In a more detailed embodiment of second first aspect, the semiconductor substrate includes an impurity diffusing region formed in the peripheral region, and the through dummy isolation structure extends continuously between the impurity diffusion region to the metal film. In yet another more detailed embodiment, the semiconductor substrate includes an insulating region formed in an outer peripheral region, the impurity diffusing region is formed within an inner peripheral region, the outer peripheral region and inner peripheral region comprise the peripheral region, and the outer peripheral region circumscribes the inner peripheral region. In a further detailed embodiment, the method further includes the steps of forming a cavity within the semiconductor substrate, forming an active electrode within the cavity that is insulated from the semiconductor substrate by an insulator, the active electrode formed to be in electrical communication with the active electrical structure, and thinning the semiconductor substrate from a rear side opposite the wiring insulating layer until the active electrode is exposed. In still a further detailed embodiment, the method further comprises the step of forming an external terminal in electrical communication with the exposed active electrode.

In yet another more detailed embodiment of the second aspect, the method further includes the step of forming an insulating region within the semiconductor substrate in the peripheral region, and where the formation of the through dummy isolation structure includes forming a dummy electrode that extends into the insulating region. In still another more detailed embodiment, the method further includes the steps of forming a cavity within the semiconductor substrate, forming an active electrode within the cavity that is insulated from the semiconductor substrate by an insulator, the active electrode formed to be in electrical communication with the active electrical structure, and thinning the semiconductor substrate from a side opposite the wiring insulating layer until the active electrode and dummy electrode are exposed. In a further detailed embodiment, the method further comprises the step of forming an external terminal in electrical communication with the exposed active electrode. In still a further detailed embodiment, the method further comprises the steps of forming a first insulating film on the rear side of the semiconductor substrate that covers the active electrode, forming a rear side contact hole within the first insulating film to expose the active electrode, filling the rear side contact hole and forming a rear side wiring over the first insulating film, forming a second insulating film covering the rear side wiring, forming a via hole through the second insulating film that exposes a portion of the rear side wiring, filling the via hole with a conductive material, and forming an external terminal in electrical communication with the conductive material occupying the via hole.

It is a third aspect of the present invention to provide a method of manufacturing a semiconductor device, the semiconductor device including a semiconductor substrate having a plurality of chip regions, each chip region including a central region and a peripheral region around the central region, comprising the steps of: (a) forming a groove in a central region of a semiconductor substrate, extending from a first main surface of the semiconductor substrate to a second surface vertically spaced from the first main surface; (b) forming an electrode within the groove; (c) forming an element in the central region of the semiconductor substrate at a side of the first main surface, (d) forming a wiring insulating film over the first main surface of the semiconductor substrate, the wiring insulating film including a top surface and at least one peripheral surface; (e) forming a peripheral wiring in the wiring insulating film in the peripheral region to surround the central region; (f) forming a chip wiring in the wiring insulating film in the central region; and (g) forming a metal film over the wiring insulating film, where the formation of the peripheral wiring and chip wiring occur concurrently, and where the peripheral wiring vertically extends between the metal film and the semiconductor substrate.

In a more detailed embodiment of third aspect, the method further comprises the step of thinning the semiconductor substrate from a side opposite the first main surface until the electrode is exposed. In yet another more detailed embodiment, the steps of forming the wiring insulating film, the peripheral wiring, the chip wiring and the electrode include the steps of: (i) forming a first interlayer insulating film on the first main surface of the semiconductor substrate, (ii) forming an element contact hole exposing a portion of the element, (iii) forming an electrode hole exposing the bottom of the groove in the central region of the first interlayer insulating film, (iv) forming a first layer peripheral groove exposing the first main surface in the peripheral region of the first interlayer insulating film, (v) forming a first layer conductive plug by filling the element contact hole with a conductive material, (vi) forming the electrode and an electrode plug in the first interlayer insulating film by filling the electrode hole, (vii) forming a first layer peripheral plug by filling the first layer peripheral groove, (viii) forming a first layer wiring on the first interlayer insulating film, thereby forming the chip wiring including the first layer wiring, the first layer conductive plug and the electrode plug, and forming a first layer peripheral wiring covering the first layer peripheral plug, (ix) forming an upper layer insulating film covering the first layer wiring and the first layer peripheral wiring on the first interlayer insulating film, thereby forming the wiring insulating film having the first interlayer insulating film and the upper layer insulating film, (x) forming an upper layer peripheral groove, exposing the first layer peripheral wiring and surrounding the central region, within the peripheral region of the upper layer insulating film, and (xi) forming an upper layer peripheral plug by filling the upper layer peripheral groove, thereby forming the peripheral wiring including the upper layer peripheral plug, the first layer peripheral plug, and the first layer peripheral wiring. In a further detailed embodiment, the chip wiring has an n-layered structure, where "n" is an integer of more than two, and the step of forming the wiring insulating film, the peripheral wiring, the chip wiring, and the electrode includes the steps of: (i) forming a first interlayer insulating film over the first main surface of the semiconductor substrate, (ii) forming an element contact hole exposing a portion of the element and an electrode hole exposing the bottom of the groove in the central region of the first interlayer insulating film, and a first layer peripheral groove exposing the first main surface in the peripheral region of the first interlayer insulating film, (iii) forming a first layer conductive plug by filling the element contact hole with a conductive material, forming the electrode and an electrode plug in the first interlayer insulating film by filling the electrode hole, and forming a first layer peripheral plug by filling the first layer peripheral groove, (iv) forming a first layer wiring on the first interlayer insulating film and a first layer peripheral wiring covering the first layer peripheral plug, (v) forming a k-layered insulating film (k being an integer of more than 2 and less than n) covering prior layer wiring and a prior layer peripheral wiring on a prior interlayer insulating film, forming a k-layered peripheral groove exposing the prior layer peripheral wiring and surrounding the central region in the peripheral region of the k-layered insulating film, and forming a k-layered peripheral plug by filling the k-layered peripheral groove, where "k" is an integer of more than two and less than "n", (vi) forming an upper layer insulating film covering an n-layered wiring and an n-layered peripheral wiring on an n-layered insulating film, thereby forming the wiring insulating film having multiple interlayer insulating films and the upper layer insulating film which are laminated, (vii) forming an upper layer peripheral groove exposing the n-layered peripheral wiring and surrounding the central region on the peripheral region of the upper layer insulating film, and (viii) forming an upper layer peripheral plug by filling the upper layer peripheral groove, thereby forming the peripheral wiring including the upper layer peripheral plug, the peripheral plugs and the peripheral wirings. In still a further detailed embodiment, the step of forming the element includes forming an impurity diffusing layer within the semiconductor substrate in the peripheral region.

In yet another more detailed embodiment of the third aspect, the method further comprises forming a through isolation structure in the peripheral region by forming a peripheral groove within the semiconductor substrate and at least partially filling the peripheral groove with an insulating material, where the step of forming the groove includes etching the peripheral region of the semiconductor substrate to surround the central region and forming the peripheral groove at the same depth as the groove. In still another more detailed embodiment, the method further comprises forming a through isolation structure in the peripheral region by forming a peripheral groove within the semiconductor substrate and at least partially filling the peripheral groove with an insulating material, where the step of forming the groove includes etching the peripheral region of the semiconductor substrate to surround the central region and forming the peripheral groove at the same depth as the groove, where the peripheral region includes a first peripheral region adjacent to the central region and a second peripheral region surrounding the first peripheral region, and where the step of forming the element includes forming an impurity diffusing layer within the semiconductor substrate in the first peripheral region. In a further detailed embodiment, the step of forming the first layer peripheral groove includes forming the first layer peripheral groove in the insulating material to the same depth as the electrode hole, and the step of forming the conductive plug and the first layer peripheral plug includes forming a peripheral electrode in the insulating material by filling the first layer peripheral groove.

In a more detailed embodiment of the third aspect, in the step of thinning the semiconductor substrate, the thickness of the semiconductor substrate is no greater than 10 μm. In yet another more detailed embodiment, the method further comprises the step of forming an external terminal in electrical communication with the electrode. In a further detailed embodiment, the method farther comprises the steps of: (i) forming a first rear side insulating film over a rear exposed surface of the semiconductor substrate, the rear exposed surface opposite the first main surface, (ii) forming a rear side contact hole exposing the electrode on the first rear side insulating film, (iii) filling the rear side contact hole and forming a rear side wiring over the first rear side insulating film, (iv) forming a second rear side insulating film covering the rear side wiring, (v) forming a via hole exposing a portion of the rear side wiring, and (vi) filling the via hole with a conductive material and forming an external terminal of conductive material in electrical communication with the via hole. In still a further detailed embodiment, after forming the external terminal, the semiconductor device is segmented into individual chips by dicing the semiconductor device in dicing regions between the chip regions.

BRIEF DESCRIPTION OF THE DRAWINGS

FIG. 7 is a schematic view of a semiconductor device according to a second embodiment of the present invention;

FIGS. 8A to 8C are process diagrams showing a method of manufacturing the semiconductor device according to the second embodiment;

DETAILED DESCRIPTION

The exemplary embodiments of the present invention are described and illustrated below to encompass semiconductor devices and methods of manufacturing the same and, more particularly, to a metal-sealed wafer level chip size package (CSP) and a method of manufacturing the same. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
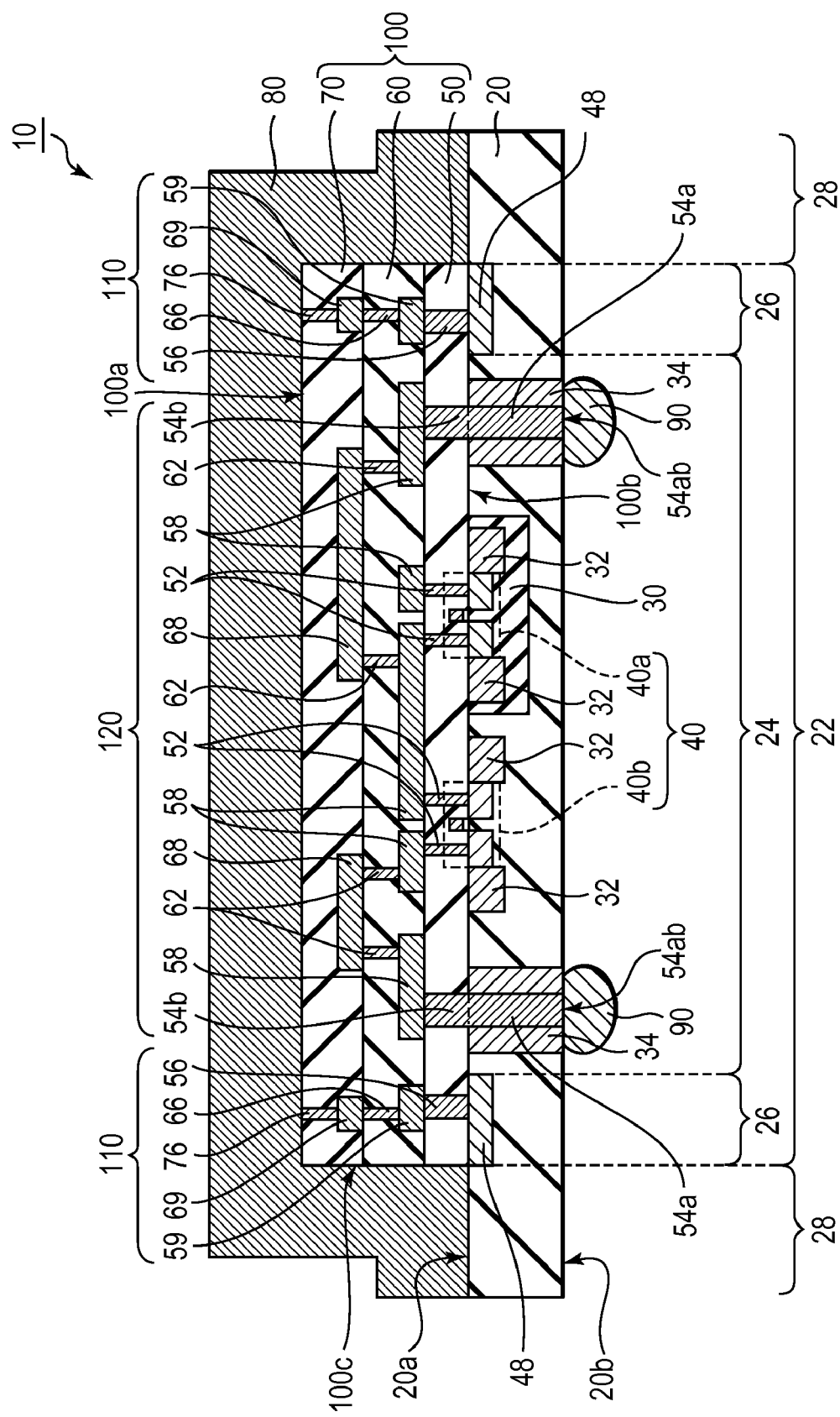
FIG. 1 is a schematic view of a semiconductor device according to a first embodiment of the present invention.

Referencing FIG. 1, a semiconductor device 10 includes a semiconductor substrate 20, active elements 40a and 40b, a through isolation structure 34, a through electrode 54a, a wiring insulating film 100, a peripheral wiring 110, a chip wiring 120 and a metal film 80.

Dicing regions 28 and a chip region 22 partitioned by the dicing regions 28 are defined in the semiconductor substrate 20. The chip region 22 is a region provided as the constituent unit of a chip size package ("CSP"). The dicing regions 28 are regions remaining around the chip region 22 when a wafer is segmented into individual chips. The chip region 22 includes a central region 24 and a peripheral region 26 adjacent to the central region 24. The central region 24 is a region in which semiconductor elements (hereinafter sometimes referred to as "elements") are formed.

In this exemplary embodiment, the semiconductor substrate 20 is a p-type silicon substrate, and the elements comprise a p-type MOS field effect transistor (PMOS) 40a and an n-type MOS field effect transistor (NMOS) 40b. In addition, in some cases, the PMOS 40a and the NMOS 40b may be generally referred to as element 40. The element 40 (40a and 40b) is formed in the central region within a side of the first main surface 20a, which is one of main surfaces of the semiconductor substrate 20 along with main surface 20b. In the central region 24, the PMOS 40a is formed in an n-type well 30 and the NMOS 40b is formed in a region outside of the n-type well 30.

An element isolation film 32 is formed adjacent to the element 40. The element isolation film 32 may be formed by filling a groove with an oxide film by use of so-called trench isolation, or may be formed by means of a local oxidation of silicon ("LOCOS") method.

An impurity diffusing layer 48 is formed at the side of the first main surface 20a in the peripheral region 26 of the semiconductor substrate 20. The impurity diffusing layer 48 is doped with the same impurity as a region serving as a source or drain of the PMOS 40a or the NMOS 40b.

The through isolation structure 34 is formed in the central region 24 of the semiconductor substrate 20. The through isolation structure 34 is formed to extend from the first main surface 20a to a second main surface 20b opposing the first main surface 20a, by filling a groove with an oxide film similar to trench isolation, which will be described in detail later.

The through electrode 54a is formed to extend from the first main surface 20a to the second main surface 20b in the through isolation structure 34. The through electrode 54a may be formed in the same way as a known conductive plug to interconnect wirings in a multi-layered wiring structure, for example, by filling an opening with tungsten.

The wiring insulating film 100 is formed on the first main surface 20a of the semiconductor substrate 20. In the following description, the wiring insulating film 100 includes a first interlayer insulating film 50, a second interlayer insulating film 60, and an upper layer insulating film 70 that are laminated in order.

The chip wiring 120 is formed in the central region 24 of the wiring insulating film 100. The chip wiring 120 includes a first layer wiring 58, a second layer wiring 68, a first layer conductive plug 52, a second layer conductive plug 62, and a through electrode plug 54b. The first layer wiring 58 is a wiring pattern formed on the first interlayer insulating film 50 and the second layer wiring 68 is a wiring pattern formed on the second interlayer insulating film 60. The first layer conductive plug 52 is formed in plural numbers in the first interlayer insulating film 50 and electrically connects the element 40 to the first layer wiring 58. The through electrode plug 54b is formed in plural numbers in the first interlayer insulating film 50 and electrically connects the through electrode 54a to the first layer wiring 58. The second layer conductive plug 62 is formed in plural numbers in the second interlayer insulating film 60 and electrically connects the first layer wiring 58 to the second layer wiring 68.

Although it has been illustrated that the chip wiring 120 has a two-layered wiring structure comprising the first layer wiring 58 and the second layer wiring 68, the chip wiring 120 is not limited to two wiring layers, but may be formed with a singly layer or three or more layers.

The peripheral wiring 110 is formed to extend from an upper side 100a to a lower side 100b of the wiring insulating film 100 in the peripheral region 26, surrounding the central region 24. The peripheral wiring 110 includes a first layer peripheral wiring 59, a second layer peripheral wiring 69, a first layer peripheral plug 56, a second layer peripheral plug 66, and an upper layer peripheral plug 76.

The first layer peripheral wiring 59 and the second layer peripheral wiring 69 are formed on the first interlayer insulating film 50 and the second interlayer insulating film 60, respectively. The first layer peripheral plug 56 is formed in the first interlayer insulating film 50 and electrically connects the impurity diffusing layer 48 to the first layer peripheral wiring 59. The second layer peripheral plug 66 is formed in the second interlayer insulating film 60 and electrically connects the first layer peripheral wiring 59 to the second layer peripheral wiring 69. The upper layer peripheral plug 76 is formed in the upper layer insulating film 70 and electrically connects the second layer peripheral wiring 69 to the metal film 80 formed on the wiring insulating film 100. The peripheral wiring 110 is formed on the impurity diffusing layer 48 in the peripheral region 26 and makes a potential of the metal film 80 equal to a potential of the semiconductor substrate 20.

The first layer peripheral plug 56, the second layer peripheral plug 66, the upper layer peripheral plug 76, the first layer peripheral wiring 59, and the second layer peripheral wiring 69 each are successively formed to surround the central region 24. As will be described hereafter, the wiring insulating film 100, the peripheral wiring 110, and the chip wiring 120 are formed using the same material and by the same method as a multi-layered wiring structure known in the art.

The metal film 80 is formed on the upper side 100a and lateral sides 100c of the wiring insulating film 100 by, for example, copper plating or the like to cover the entire surface of the wiring insulating film 100. The metal film 80 is formed to extend from the lateral sides 100c of the wiring insulating film 100 to the first main surface 20a of the semiconductor substrate 20 in the dicing region 28. The metal film 80 allows metal sealing for the wiring insulating film 100 and a region of the semiconductor substrate 20 which contacts the wiring insulating film 100.

An external terminal 90 is formed on a second main surface 54ab of the through electrode 54a. Since the first surface 20a of the semiconductor substrate 20 is sealed by metal, the element 40 is accessible by way of the second main surface 20b, which is the rear side of the substrate, using the through electrode 54a and the external terminal 90.

According to the semiconductor device 10 of this first exemplary embodiment, since the peripheral wiring 110 is formed to surround the chip wiring 120, it is possible to prevent water from penetrating from the peripheral region into the semiconductor device even when water penetrates through an interface between the metal film 80 and the semiconductor substrate 20. As a result, the semiconductor device of this embodiment provides enhanced waterproofing as compared to a semiconductor device sealed only with a metal film 80.

In this exemplary embodiment, thickness of the semiconductor substrate 20 may be 10 µm or less by using a film thinning process. Although the through isolation structure 34 and the through electrode 54a are formed before the semiconductor substrate 20 is thinned, their depth may be set to be larger than thickness of the semiconductor substrate 20 after the semiconductor substrate 20 is thinned. Thus, by setting the thickness of the semiconductor substrate 20 to be less than 10 µm, the depth of through isolation structure 34 and the through electrode 54a can be set to be 10 µm, thereby making an aspect ratio small. As a result, it is possible to suppress detective filling and hence increase reliability of elements.

Thickness of the metal film 80 may be set to be several tens to several hundred µm so as to maintain a mechanical strength after the semiconductor substrate is thinned. With this configuration, even when the thickness of the semiconductor substrate 20 is small, the semiconductor device 10, which is the CSP, keeps its thickness to more than a specified value by a degree of the thickness of the metal film 80 as a whole. For example, even if the thickness of a silicon substrate is 10 µm in a conventional CSP having a thickness of 50 µm or so, the entire thickness of the CSP remains unchanged when the thickness of the metal film is 40 µm, which facilitates handling in a mounting process and so on.

Figure 2A:
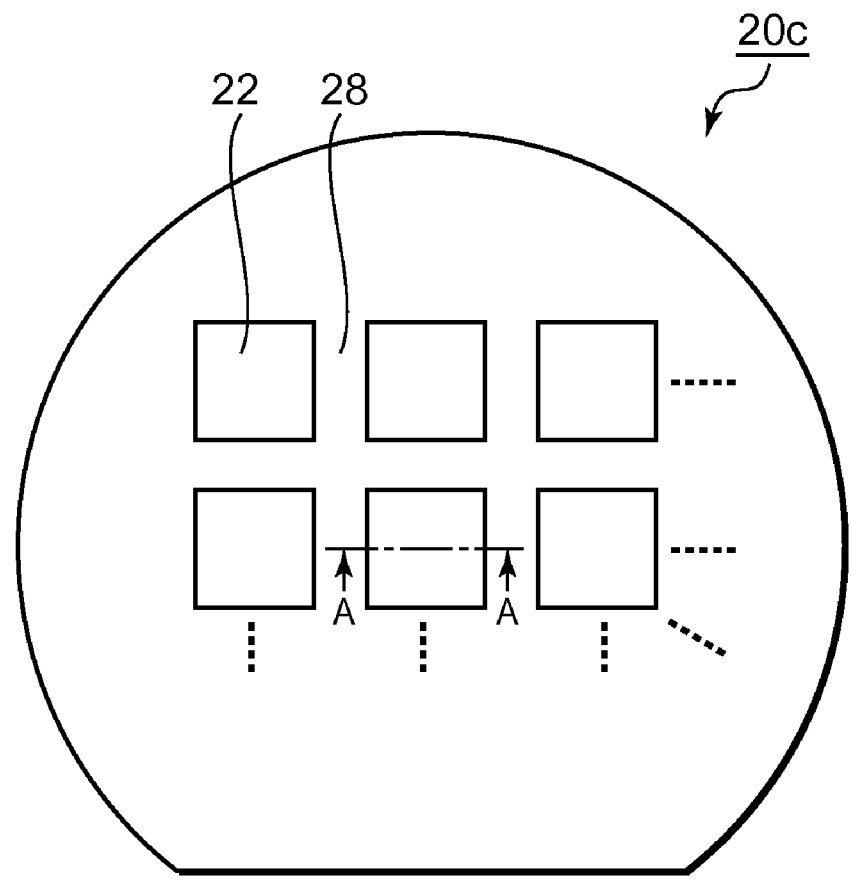
FIGS. 2A and 2B are process diagrams (1) showing a method of manufacturing the semiconductor device according to the first embodiment.
Figure 2B:
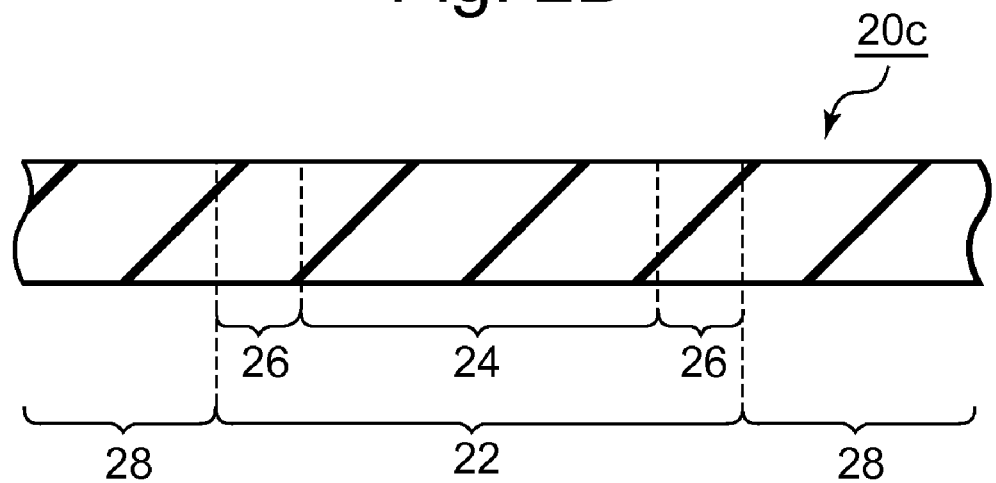

Referencing FIGS. 2A and 2B, fabrication of the afore-described semiconductor device 10 begins with a semiconductor substrate 20c prepared to have a dicing region 28 and a plurality of chip regions 22 partitioned by the dicing region 28. The chip regions 22 each include a central region 24 and a peripheral region 26 adjacent to the central region 24. Thereafter, semiconductor elements, wiring patterns and so on are formed on a first main surface 20a of the semiconductor substrate 20c.

Figure 3A:
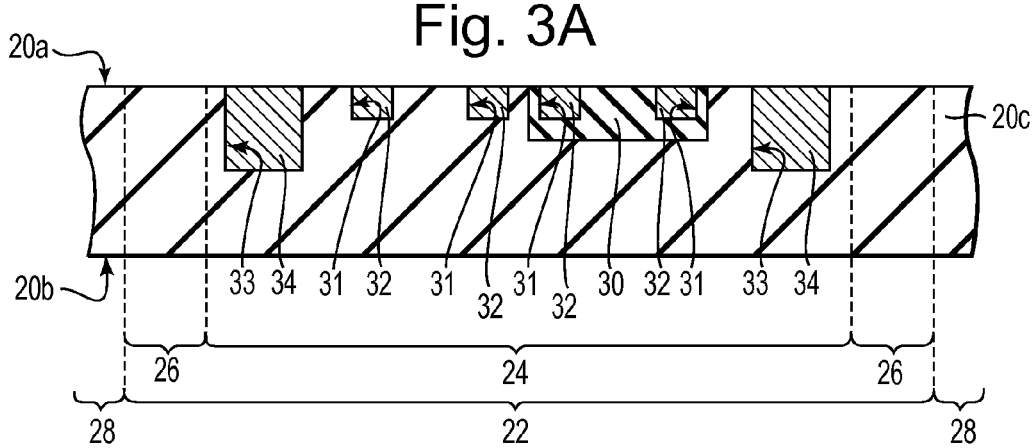
FIGS. 3A to 3C are process diagrams (2) showing a method of manufacturing the semiconductor device according to the first embodiment.

Referring to FIG. 3A, an n-type well 30 is formed on the first main surface 20a of the semiconductor substrate 20c by doping the first main surface 20a with n-type impurity. Here, depth of the n-type well 30 from the first main surface 20a is set to be approximately 3 µm or so.

Next, element isolation grooves 31 and through isolation grooves 33 are formed in the central region 24 of the semiconductor substrate 20, extending from the first main surface 20a toward a second main surface 20b opposing the first main surface 20a, by means of photolithography and dry etching known in the art. Specifically, these grooves are formed by using mask to expose regions in which the element isolation grooves 31 are to be formed. Next, exposed portions of the semiconductor substrate 20c are partially etched out to form the element isolation grooves 31. It should be noted that in this exemplary embodiment, element isolation grooves 31 are formed in the regions where the through isolation grooves 33 will be formed. Thereafter, a new mask is formed to expose regions in which the through isolation grooves 33 are to be formed, and the exposed portions of the semiconductor substrate 20c are further etched out. Here, the element isolation grooves 31 are formed to depth of, for example, 2 µm, which is shallower than the n-type well. The through isolation grooves 33 are formed to depth of, for example, 10 µm, which is deeper than the element isolation grooves 31.

Next, the element isolation grooves 31 and the through isolation grooves 33 are filled with an oxide to form element isolation films 32 and through isolation parts 34, respectively. To form the element isolation films 32 and through isolation parts 34, an oxide film is formed on the bottom and lateral side of the element isolation grooves 31 and the through isolation grooves 33 by means of thermal oxidation. Next, an oxide film is deposited in the element isolation grooves 31 and the through isolation grooves 33 and on the first main surface 20a of the semiconductor substrate 20c by means of a chemical vapor deposition ("CVD") method. Thereafter, the deposited oxide film is planarized by means of, for example, a chemical mechanical polishing ("CMP") method so that the element isolation grooves 31 and the through isolation grooves 33 are filled with the deposited oxide film, thereby obtaining the element isolation films 32 and the through isolation parts 34, respectively.

Although the foregoing element isolation has been exemplified using so-called trench isolation in that the element isolation grooves (trench) 31 are filled with an oxide film, the element isolation is not limited to this trench isolation method. As an alternative, the element isolation films 32 may be formed by means of a local oxide of silicon ("LOCOS") method known in the art. In this case, since it is not required to form the element isolation groove 31, the through isolation groove 33 may be formed by one etching process.

Figure 3B:
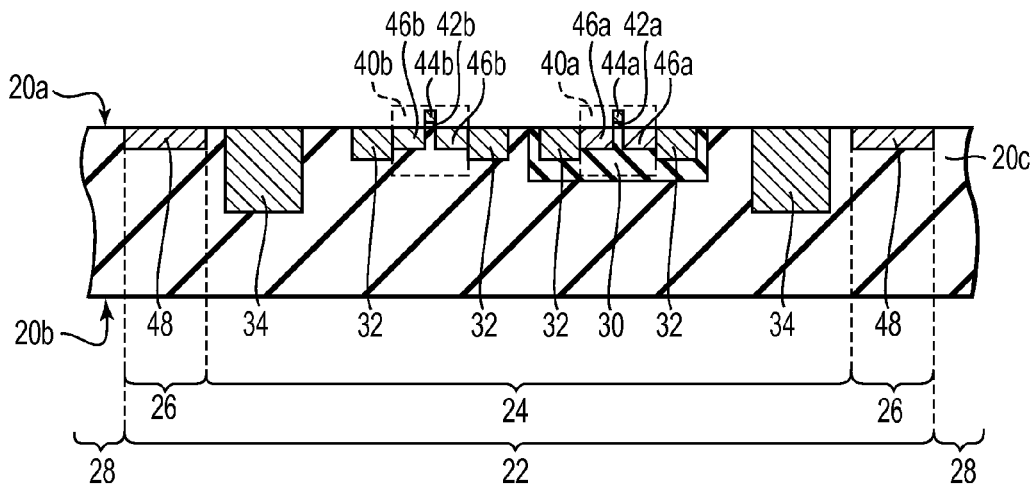

Referencing FIG. 3B, an element 40 is formed in the central region 24 at the side of the first main surface 20a of the semiconductor substrate 20c. Here, as the element 40, a PMOS 40a is formed in the n-type well 30 and an NMOS 40b is formed in a region of the semiconductor substrate 20c in which the n-type well 30 is not formed. The PMOS 40a and the NMOS 40b may be formed by means of any suitable method known in the art. For example, a silicon oxide film and a polysilicon film having decreased resistance with impurity doped therein are laminated in order on the first main surface 20a, and then, these silicon oxide and polysilicon films are patterned to form gate insulating films 42a, 42b and gate electrodes 44a, 44b, respectively. Next, impurity diffusing layers 46a, which serve as a source and a drain, respectively, are formed with the gate electrodes 44a placed therebetween. At the same time, impurity diffusing layers 46b, which serve as a source and a drain, respectively, are formed with the gate electrodes 44b placed therebetween. Thereafter, a metal film is formed on the impurity diffusing layers 46a, 46b by means of a sputtering method and then is annealed to silicidize a surface of the impurity diffusing layers 46a, 46b at a side of the first main surface 20a.

In the process of forming the element 40, at the time of forming the impurity diffusing layers 46a, 46b serving as the source and the drain, an impurity diffusing layer 48 is formed in the peripheral region 26 at the side of the first main surface 20a of the semiconductor substrate 20c.

Figure 4A:
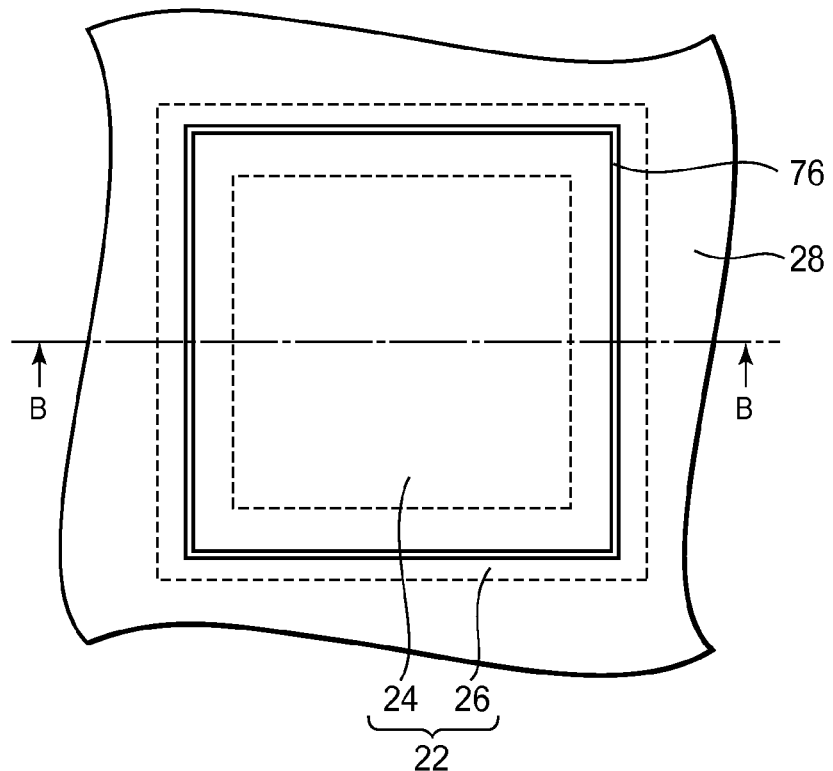
FIGS. 4A and 4B are process diagrams (3) showing a method of manufacturing the semiconductor device according to the first embodiment.
Figure 4B:
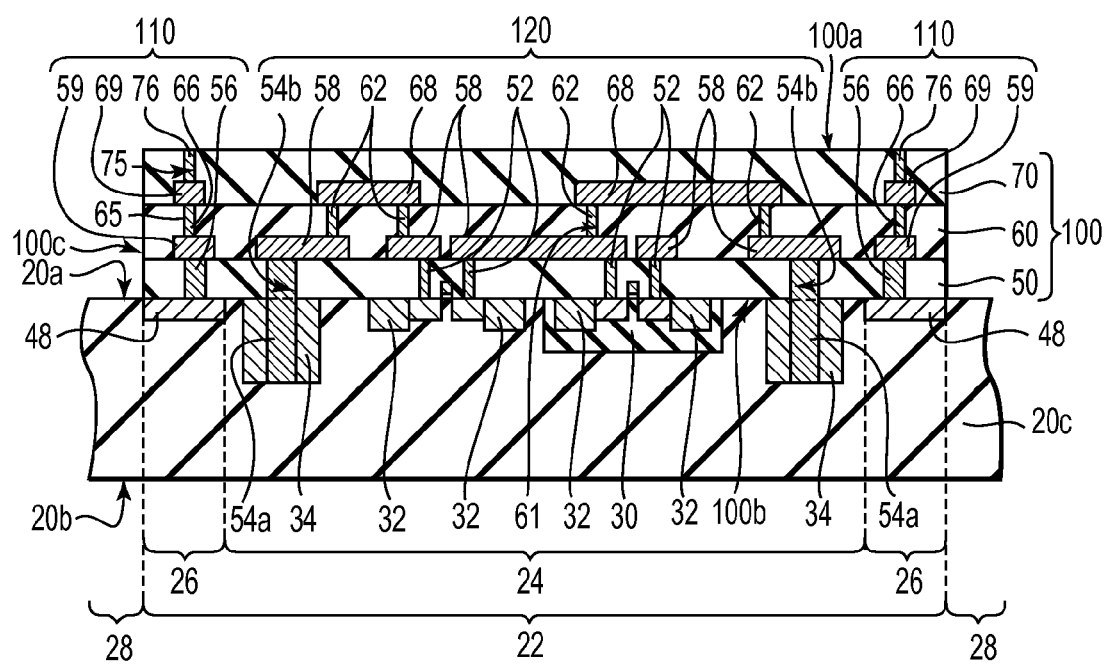

Referring to FIG. 4B, a wiring insulating film 100, a peripheral wiring 110, and a chip wiring 120 are then formed on the first main surface 20a of the semiconductor substrate 20c, and through electrodes 54a are formed in the through isolation parts 34. The peripheral wiring 110 is formed to extend from an upper side 100a to a lower side 100b of the wiring insulating film 100 in the peripheral regions 26 of the wiring insulating film 100, surrounding the central region 24. The chip wiring 120 is formed in the central region 24 of the wiring insulating film 100.

Figure 3C:
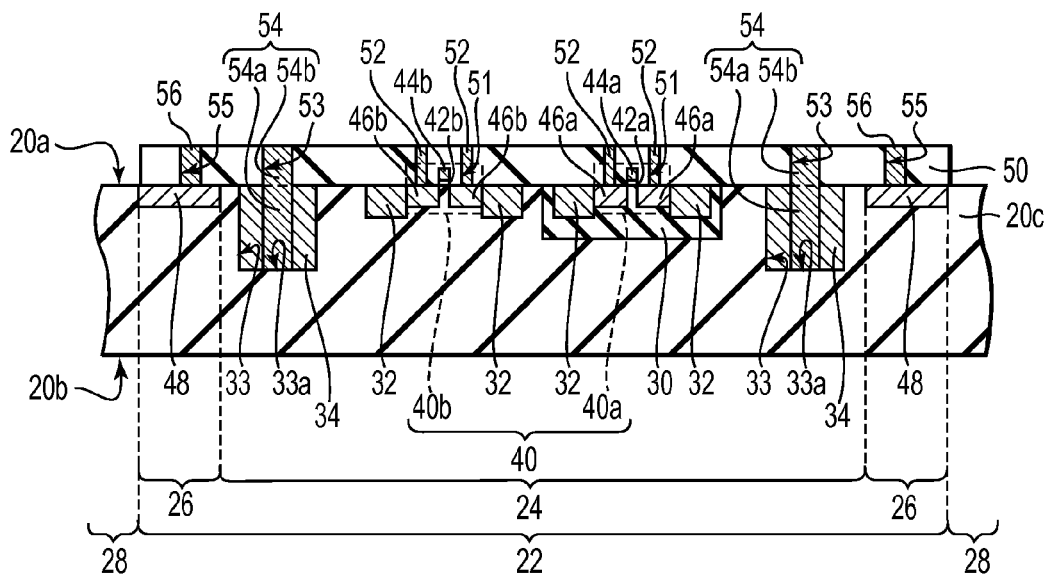

Referring to FIG. 3C, in order to form the wiring insulating film 100, a first interlayer insulating film 50 is formed on the first main surface 20a of the semiconductor substrate 20c. The first interlayer insulating film 50 is formed by depositing a silicon oxide film on the first main surface 20a by means of, for example, a CVD method, and then planarizing the deposited silicon oxide film by means of a CMP method.

Next, the first interlayer insulating film 50 in the central region 24 is subjected to photolithography and dry etching to form element contact holes 51 to expose portions of the element 40 such as the PMOS 40a, the NMOS 40b, and so on. Specifically, the element contact holes 51 expose the impurity diffusing layers 46a, 46b. It should also be understood that, while not shown, contact holes may be formed to expose the gate electrodes 44a, 44b. In addition, through electrode holes 53 are formed at the time of forming the element contact holes 51. The through electrode holes 53 are formed in the first interlayer insulating film 50 and the through isolation parts 34 to expose the bottom 33a of a through isolation groove 33.

In addition, at the time of forming the element contact holes 51 and the through electrode holes 53, first layer peripheral groove 55 to expose the first main surface 20a of the semiconductor substrate 20c are formed in the first interlayer insulating film 50 in the peripheral regions 26. These first layer peripheral groove 55 is successively formed to surround the central region 24. In addition, in the etching process for forming the element contact holes 51, through electrode holes 53, and the first layer peripheral groove 55, the first interlayer insulating film 50 in the dicing region 28 is also removed (see FIG. 4A).

Next, first layer conductive plugs 52 are formed by filling the element contact holes 51 with a conductive material. In addition, by filling the through electrode holes 53 with a conductive material 54, through electrodes 54a are formed in the semiconductor substrate 20c and through electrode plugs 54b are formed in the first interlayer insulating film 50. In addition, the first layer peripheral groove 55 is filled with a conductive material to form first layer peripheral plugs 56. The first layer conductive plugs 52, the through electrode plugs 54b, the through electrodes 54a, and the first layer peripheral plugs 56 may be formed in the same manner as a conventional contact plug known in the art. For example, titanium nitride ("TiN") and tungsten are deposited in order by a CVD method to fill the element contact holes 51, the through electrode holes 53, and the first layer peripheral groove 55. Thereafter, the deposited titanium nitride (TiN) and tungsten are then planarized by means of a CMP method, thereby forming the first layer conductive plugs 52, the through electrode plugs 54b, the through electrodes 54a, and the first layer peripheral plugs 56 (FIG. 3C).

Referring to FIG. 4B, a first layer wiring 58 is formed on the first interlayer insulating film 50. The first layer wiring 58 establishes electrical communication between some of the first layer conductive plugs 52 themselves and/or between some of the first layer conductive plugs 52 and some of the through electrode plugs 54b. In addition, a first layer peripheral wiring 59 is formed on the first interlayer insulating film 50 and over the first layer peripheral plug 56 to surround the central region 24. The first layer wiring 58 and the first layer peripheral wiring 59 are formed by forming a metal film by means of, for example, a sputtering method, and then patterning the metal film. Material for the first layer wiring 58 and the first layer peripheral wiring 59 may be copper, an aluminum alloy, or any other suitable material(s).

Next, a second interlayer insulating film 60 is formed on the first interlayer insulating film 50 to cover the first layer wiring 58 and the first layer peripheral wiring 59. Next, the second interlayer insulating film 60 is subjected to photolithography and dry etching to form via holes 61 to expose portions of the first layer wiring 58 and a second layer peripheral groove 65 to expose the first layer peripheral wiring 59. The second layer peripheral groove 65 is successively formed to surround the central region 24.

Referring to FIGS. 4A and 4B, the second interlayer insulating film 60 deposited in the dicing region 28 is also removed, like the first interlayer insulating film 50, during the etching process for forming the via holes 61 and the second layer peripheral groove 65.

Referring back to FIG. 4B, the via holes 61 and the second layer peripheral groove 65 are filled with a conductive material to form second layer conductive plugs 62 and a second layer peripheral plug 66, respectively, and then a second layer wiring 68 and a second layer peripheral wiring 69 are formed on the second interlayer insulating film 60.

Next, an upper layer insulating film 70 is formed to cover the second layer wiring 68 and the second layer peripheral wiring 69. The upper layer insulating film 70 may comprise a silicon oxide film formed by means of a CVD method, like the first interlayer insulating film 50 and the second interlayer insulating film 60. The first interlayer insulating film 50, the second interlayer insulating film 60, and the upper layer insulating film 70 each are formed at thickness of several hundred nanometers. As an alternative, the upper layer insulating film 70 may comprises a resin insulating film formed by direct application of the resin. In this alternate exemplary circumstance, an exemplary resin includes polyimide.

Next, the upper layer insulating film 70 is etched to form an upper layer peripheral groove 75 to expose the second layer peripheral wiring 69. At this time, the upper layer insulating film 70 deposited in the dicing region 28 is also removed.

Next, the upper layer peripheral groove 75 may be filled with a conductive material to form an upper layer peripheral plugs 76 and/or the upper layer peripheral groove 75. Alternatively, the upper layer peripheral groove 75 may be filled with a metal film 80.

Although the chip wiring 120 has been described in terms of a two-layered structure, the chip wiring 120 is not limited to this exemplary configuration, but may be formed using a single layer or three or more layers. In the case of the single-layer structure, after forming the first layer wiring and the first layer peripheral wiring, the upper layer insulating film may be formed. In the case of the multiple layered structure, after forming the first layer wiring and the first layer peripheral wiring, a k-layered (k is an integer of more than 2) insulating film, a k-layered wiring, a k-layered peripheral wiring, k-layered conductive plugs, and a k-layered peripheral plug may be formed in order.

Figure 5:
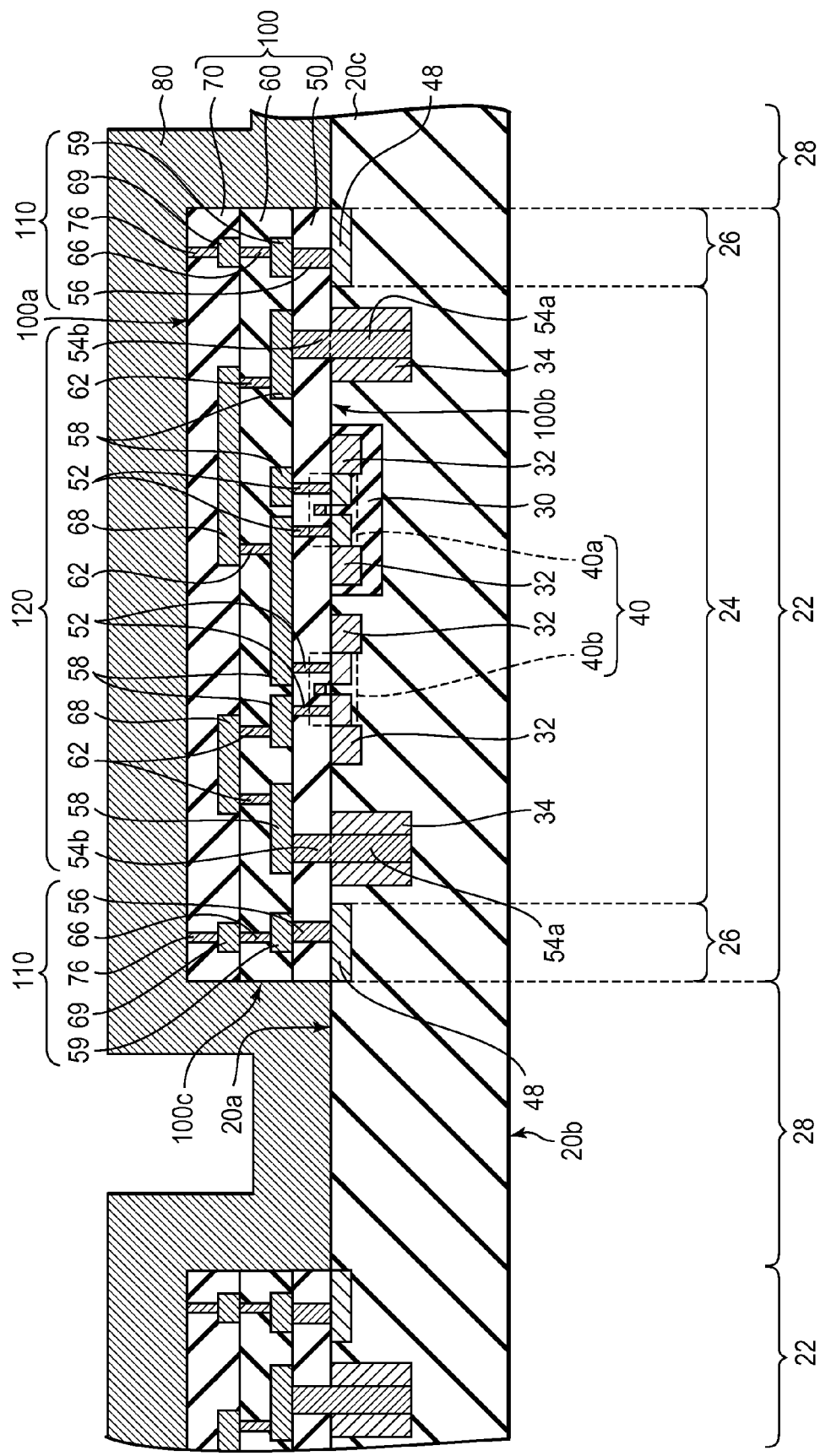
FIG. 5 is a process diagram (4) showing a method of manufacturing the semiconductor device according to the first embodiment.

Referring to FIG. 5, a metal film 80 is formed on the upper side 100a and lateral sides 100c of the wiring insulating film 100 including the first interlayer insulating film 50, the second interlayer insulating film 60, and the upper layer insulating film 70. The metal film 80 may be formed by means of sputtering, plating, CVD, of a combination thereof.

In addition, the metal film 80 is used as a support when the semiconductor substrate 20c is thinned in a later process. Thus, the metal film 80 is formed at thickness of several tens of μm to several hundred μm so as to maintain the mechanical strength of the wafer after the semiconductor substrate 20c is thinned. If the thickness of the metal film 80 is more than 40 μm, it facilitates handling in a mounting process, even after a wafer is segmented into individual chips.

Figure 6:
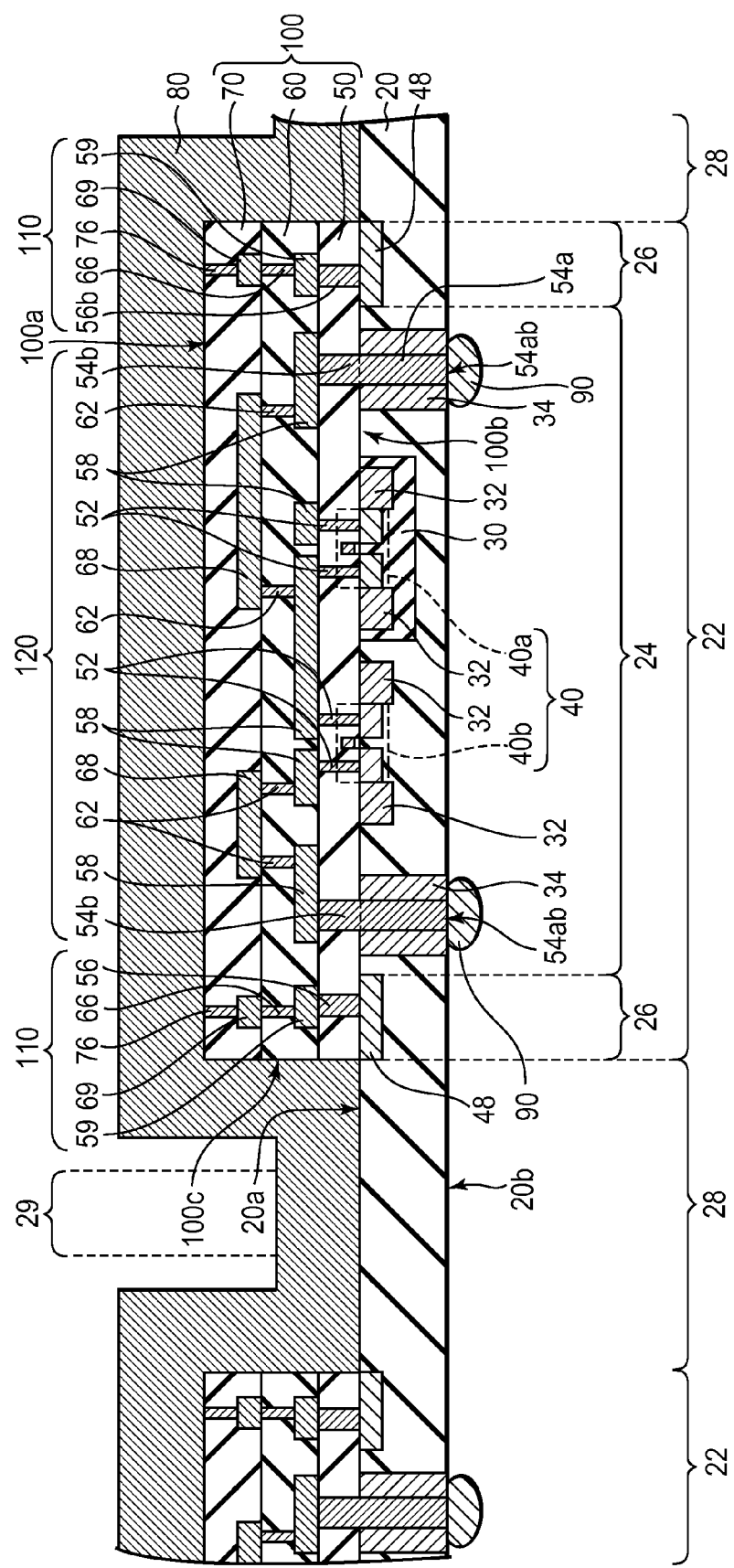
FIG. 6 is a process diagram (5) showing a method of manufacturing the semiconductor device according to the first embodiment.

Referencing FIG. 6, the semiconductor substrate 20 is thinned until the through electrode 54a is exposed by grinding or mechanically polishing the semiconductor substrate 20 from the side of the second main surface 20b. In addition, after the semiconductor substrate 20 is thinned, the entire surface of the semiconductor substrate 20 may be subjected to chemical etching (wet etching) using an etchant containing hydrofluoric acid and nitric acid, for example.

Here, since the depth of the through electrode 54a is approximately 10 μm, the thickness of the thinned semiconductor substrate 20 is approximately 10 μm. On the other hand, in order to control a potential of the semiconductor substrate 20 or a potential of the n-type well 30, the thickness of the thinned semiconductor substrate 20 may be set to a minimum of 3 μm, for example, so as to prevent the element isolation film 32 from being exposed.

An external terminal 90 is formed on the second main surface 54ab of the through electrode 54a. Thereafter, the wafer is segmented into individual chips by dicing the wafer along a dicing line 29. As a result, the metal-sealed wafer level CSP 10 shown in FIG. 1 is obtained.

If the metal film 80 remains in the dicing line 29, a blade of a dicing apparatus may be clogged due to metal powders produced in dicing. Thus, before dicing, the metal film may be removed along the dicing line 29 in the dicing region 28 by means of, for example, photolithography and etching known in the art.

According to the method of manufacturing the semiconductor device of the first exemplary embodiment, the semiconductor substrate can be thinned to less than 10 μm by using the metal film 80 as the support structure. Thus, it is possible to form the through electrodes 54a and the through isolation parts 34 to isolate the through electrodes from other portions with a low aspect ratio, which results in suppression of defective filling. In addition, since the peripheral wiring 110 surrounding the central region 24 can be formed at the same time as forming the chip wiring 120, it is possible to form a waterproof wafer level CSP without increasing the number of processes.

Although the PMOS and the NMOS have been exemplified as the elements in this first exemplary embodiment, the present invention is not limited to this example. A desired number of any suitable active or passive elements may be formed depending on the overall chip design. If any impurity diffusing layer is not formed in the central region, such as not forming the PMOS or the NMOS as the elements, an impurity diffusing region may be separately formed in a peripheral region.

Referencing FIG. 7, a second exemplary semiconductor device 11 is different from that of the first exemplary embodiment in that the former has a peripheral oxide film formed on the semiconductor substrate in the peripheral region. Except for the peripheral oxide film, the second exemplary embodiment has the same configuration as the first exemplary embodiment and, therefore, an explanation as to each of the respective structures has been omitted for purposes of brevity. Accordingly, reference numerals in common between the first and second exemplary embodiments refer to common structure.

In a semiconductor device 11 according to this second exemplary embodiment, a peripheral region 26 is divided into a first peripheral region 26a and a second peripheral region 26b. The first peripheral region 26a is surrounds the central region 24, while the second peripheral region 26b surrounds the first peripheral region 26a. An impurity diffusing layer 49 is formed at a side of the first main surface 20a of the first peripheral region 26a of the semiconductor substrate 20, and the peripheral wiring 110 is connected to the impurity diffusing layer 49. In this exemplary semiconductor device 11, the peripheral plug 56, formed within the first interlayer insulating film 50, comprises a portion of the dummy isolation structure. A peripheral oxide film 36 is formed to extend from the first main surface 20a to the second main surface 20b in the second peripheral region 26b surrounding the first peripheral region 26a.

According to the semiconductor device 11 of this second exemplary embodiment, the lateral sides of the chip region 22 are covered since the oxide film is formed in the periphery of the semiconductor substrate 20. Thus, the lateral sided are covered with the same kind of material and, accordingly, it is possible to more effectively prevent water from penetrating into the semiconductor device 11 due to the oxide film even when the water penetrates through the interface between the metal film and the silicon substrate.

Referring to FIGS. 8A-8C, manufacturing this second exemplary semiconductor device 11 is different from that of the first exemplary embodiment in that an oxide film 36 is formed within the semiconductor substrate 20 in a peripheral region. Except for the oxide film formation, the second exemplary embodiment is fabricated in the same manner as that already recited for the first exemplary embodiment. For purposes of brevity, a redundant explanation of those same process steps has been omitted in lieu of a discussion of only those steps substantially differing between the embodiments 10, 11.

Referencing FIG. 8A, the peripheral region 26 is divided into the first peripheral region 26a, which is adjacent to and surrounds the central region 24, and the second peripheral region 26b surrounding the first peripheral region 26a. When forming the through isolation groove 33, the second peripheral region 26b of the semiconductor substrate 20c is etched to surround the central region 24, and the peripheral through groove 35 is formed at the same depth as the through isolation groove 33. When forming the through isolation parts 34, the peripheral through groove 35 is filled with a insulating material to form the peripheral oxide film 36.

Referring to FIG. 8B, the impurity diffusing layer 49 is formed at a side of the peripheral oxide film 36 within the semiconductor substrate 20 at the same time as the impurity diffusing layers 46a, 46b.

Next, referencing FIG. 8C, the first layer conductive plugs 52, the through electrode plugs 54b, the through electrodes 54a, and the first layer peripheral plug 56 are formed. Accordingly, subsequent processes are the same as those discussed above for fabricating the first exemplary embodiment and, therefore, a redundant explanation has been omitted to further brevity. Moreover, since the peripheral oxide film 36 surrounding the central region 24 of this second exemplary embodiment 11 is formed at the same time as forming the through isolation structure 34, it is possible to provide a waterproofed semiconductor device without increasing the number of fabrication processes.

Figure 9:
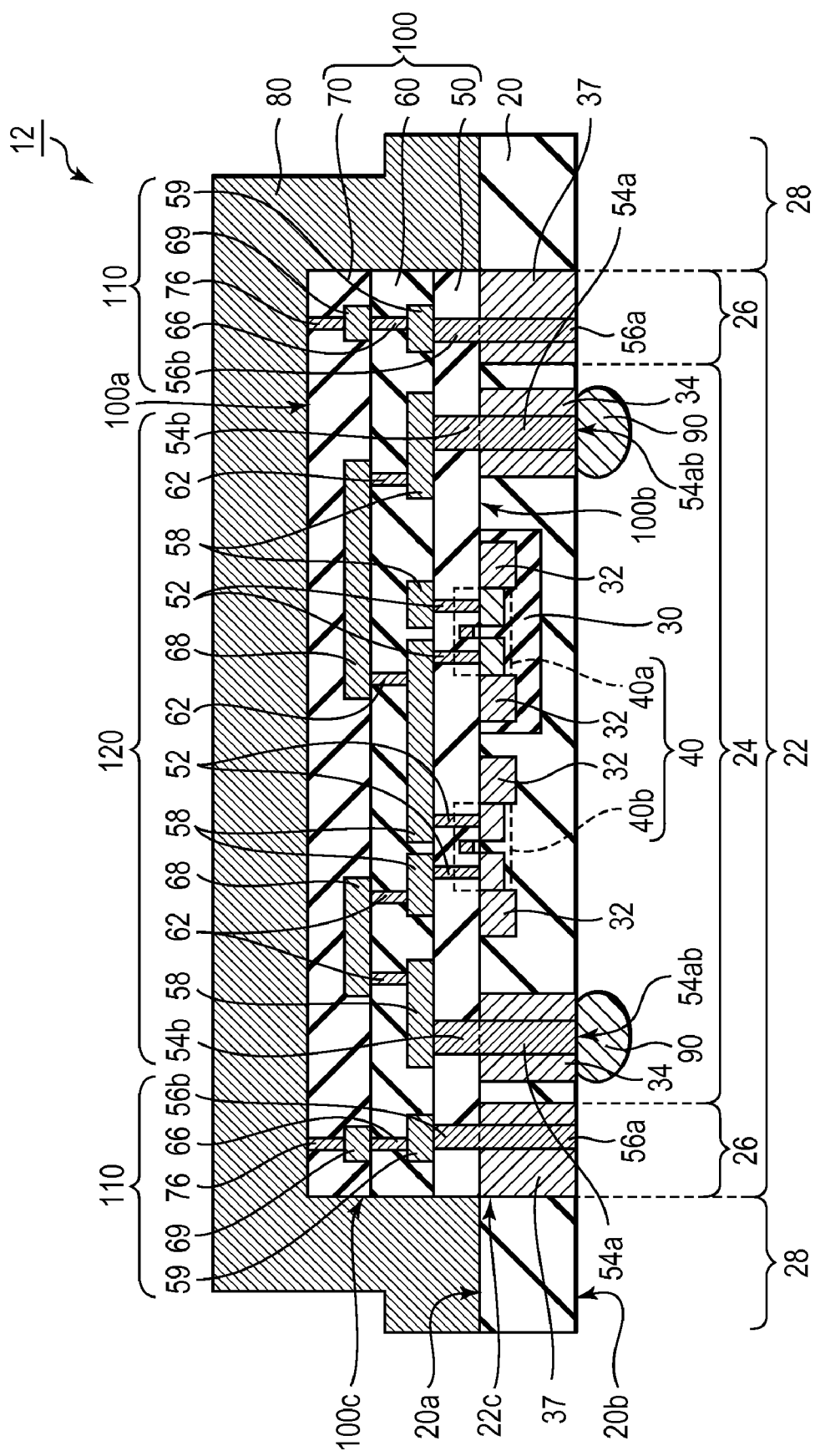
FIG. 9 is a schematic view of a semiconductor device according to a third embodiment of the present invention.

Referring to FIG. 9, a third exemplary semiconductor device 12 is different from that of the first exemplary embodiment by way of its peripheral region structure. Except for this modified peripheral region structure, the third exemplary embodiment has the same configuration as the first exemplary embodiment and, therefore, an explanation of the common features between the two exemplary embodiments will be omitted. Consistent with this purpose, reference numerals in common between the first and third exemplary embodiments refer to common structure.

This third exemplary semiconductor device 12 includes a peripheral oxide film 37 surrounding the central region 24. The peripheral oxide film 37 is formed to extend from the first main surface 20a to the second main surface 20b in the peripheral region 26 of the semiconductor substrate 20. In addition, the semiconductor device 12 includes a peripheral through dummy isolation structure 56a extending from the first main surface 20a to the second main surface 20b through the peripheral oxide film 37. The peripheral wiring 110 is in electrical communication with the peripheral dummy isolation structure 56a so that the peripheral plug 56b formed within the first interlayer insulating film 50 comprises part of the peripheral dummy isolation structure.

According to this third exemplary semiconductor device 12, since the peripheral oxide film is formed in the peripheral region 26, lateral sides 22c, 100c of the chip region 22 are covered with oxide films 37, 100. Both the peripheral film 37 and the wiring insulating film 100 are oxide films. Thus, there exists no interface between the silicon 20 and the oxide films 37, 100 in the lateral sides 22c, 100c of the chip region 22. As a result, it is possible to prevent water from penetrating into the semiconductor device 12 due to the oxide films 37, 100 even when water penetrates through the interface between the metal film 80 and the silicon substrate 20.

In addition, since the peripheral dummy isolation structure 56a is formed through the peripheral oxide film 37, it is possible to make the metal film 80 electrically floating. In addition, by forming a wiring pattern at a side of the second main surface 20b, which is the rear side of the semiconductor substrate 20, a potential of the metal film 80 may be set to be any value after metal-sealing.

Figure 10A:
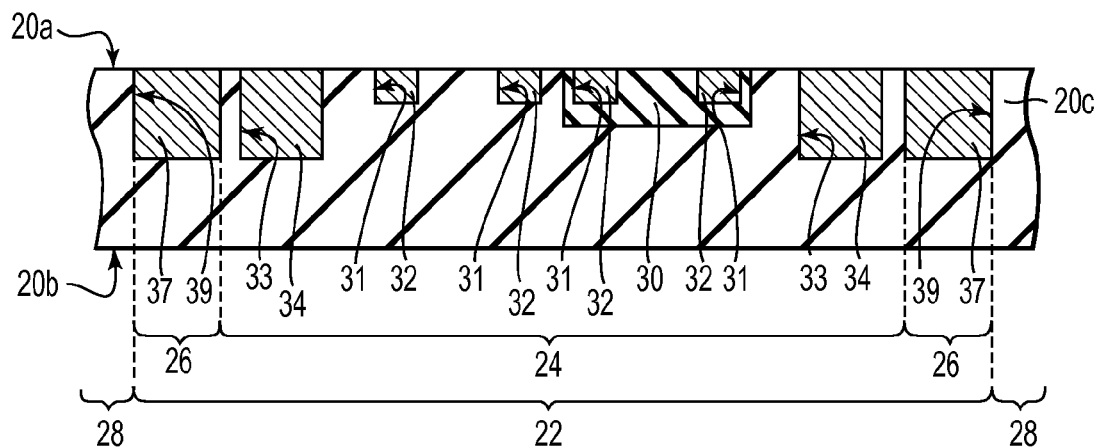
FIGS. 10A and 10B are process diagrams showing a method of manufacturing the semiconductor device according to the third embodiment.
Figure 10B:
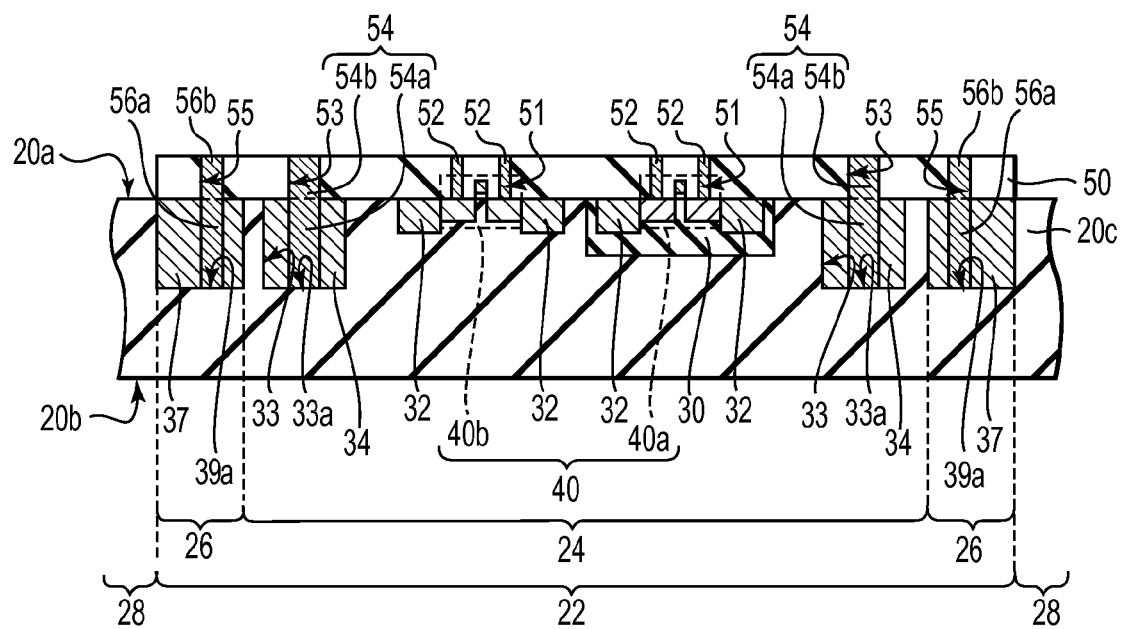

Referencing FIGS. 10A and 10B, fabrication of this third exemplary semiconductor device 12 is different from that of the first exemplary embodiment in terms of how the peripheral region is formed. Except for this subprocess, the third exemplary embodiment is fabricated in accordance with the same processes as the first exemplary embodiment and, therefore, explanation of these redundant steps has been omitted for purposes of brevity. Accordingly, reference numerals in common between the first and third exemplary embodiments refer to common structure.

Referring specifically to FIG. 10A, while forming the through isolation grooves 33, the peripheral region 26 of the semiconductor substrate 20c is etched to surround the central region 24, and the peripheral through groove 39 is formed at generally the same depth as the through isolation grooves 33. While forming the through isolation parts 34, the through isolation grooves 33 are filled with an insulating material and the peripheral through groove 39 is filled with an insulating material to form the peripheral oxide film 37.

Referencing FIG. 10B, the elements 40 are formed in the same way as the first exemplary embodiment. However, an impurity diffusing layer is not formed in the peripheral region 26. While forming the element contact holes 51, the through electrode holes 53 and the first layer peripheral groove 55 are formed to extend through the first interlayer insulating film 50 and through the oxide films 34, 37, thereby exposing the bottoms of the grooves 33, 39. While forming the conductive plugs 52 and the peripheral plug 56b, the peripheral through groove 39a is filled with a conductive material to form the peripheral dummy isolation structure 56a in the peripheral oxide film 37. Subsequent processes are the same as those in the manufacturing method of the semiconductor device of the first exemplary embodiment and, therefore, an explanation of these steps has been omitted for purposes of brevity. According to the manufacturing method of this third exemplary embodiment, since the peripheral oxide film 37 and the peripheral dummy isolation structure 56a in the periphery of the silicon substrate 20 can be formed at the same time as forming the through isolation structure 34 and the through electrode 54a, the number of process steps does not increase.

Figure 11:
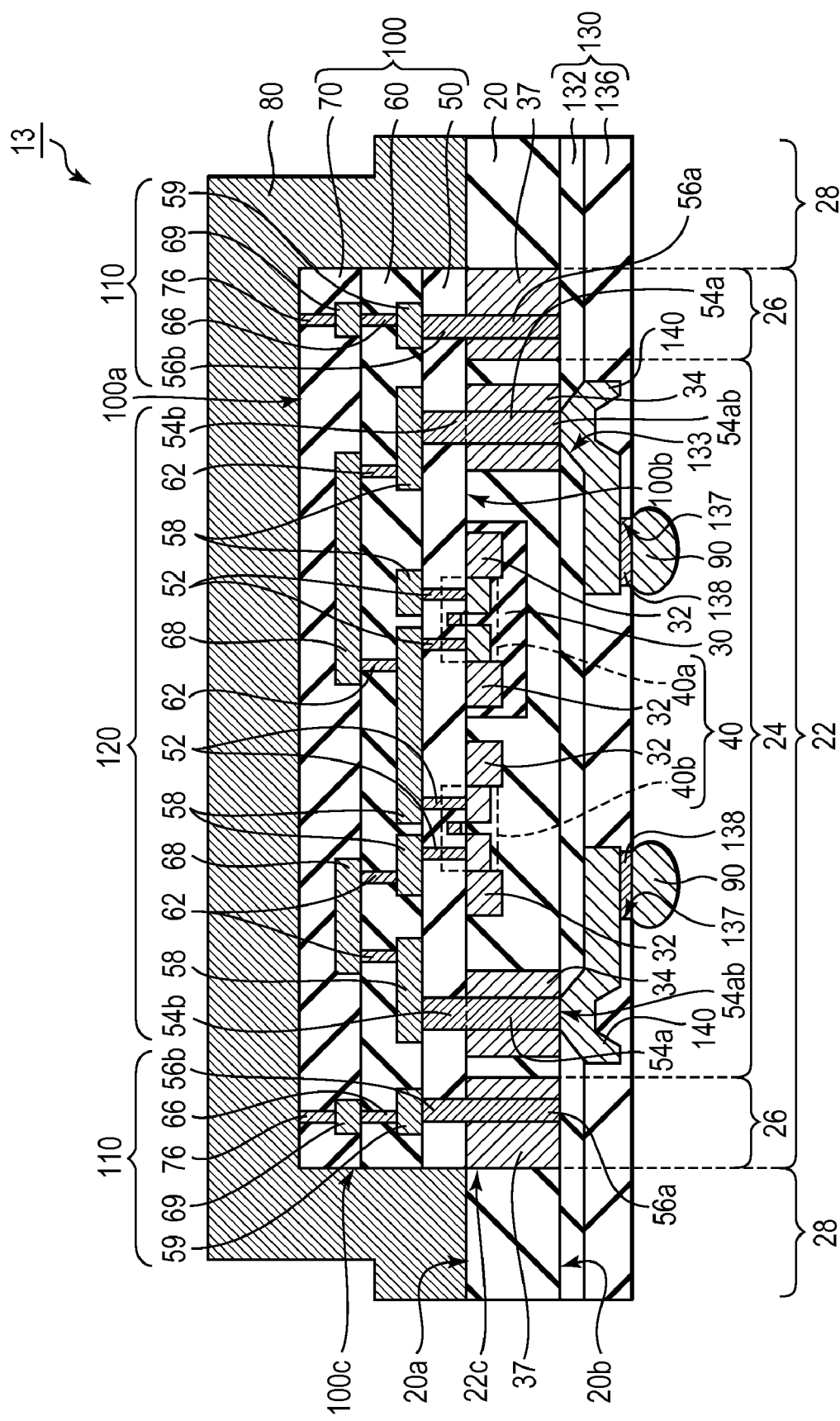
FIG. 11 is a schematic view of a modification of the semiconductor device according to the third embodiment.

Referencing FIG. 11, an alternate third exemplary embodiment of a semiconductor device 13 includes a rear side insulating film 130 formed on a second main surface 20b and an external terminal 90 formed on the rear side insulating film 130. A rear side wiring pattern 140 is formed in the rear side insulating film 130 so as to electrically connect the external terminal 90 to a through electrode 54a.

Fabrication of this third alternate exemplary embodiment 13 includes those same steps as discussed for forming the third exemplary embodiment 12 all the way to just prior to the formation of the external terminal 90 is formed. In other words, one fabricating this third alternate exemplary embodiment 13 would follow all of the process steps necessary to form the device shown in FIG. 9, but for formation of the external terminal 90.

Referring back to FIG. 11, prior to the formation of the external terminal 90, the first rear side insulating film 132 is formed on the second main surface 20b. Thereafter, rear side contact holes 133 are formed through the insulating film 132 to expose the through electrode 54a. The contact holes 133 are filled with a conductive material. At the same time as the contact holes 133 are being filled, a conductive layer is formed on the insulating film 132, which is thereafter patterned for form a rear side wiring pattern 140. Alternatively, the contact hole filling and wiring patterning may be performed at the same time using a photoresist mask to delineate those areas receiving conductive material.

After the contact holes 133 and wiring pattern 140 are formed, a second rear side insulating film 136 is formed to cover the rear side wiring pattern 140. In this exemplary embodiment, the rear side insulating film 130 is composed of the first rear side insulating film 132 and the second rear side insulating film 136. Next, via holes 137 are formed through the second rear side insulating film 136 to expose a portion of the rear side wiring pattern 140. Thereafter, the via holes 137 are filled with a conductive material 138. Subsequent to the filling of the via holes 137, external terminals 90 are formed to be in contact with the conductive material 138 filling the via holes 137. Accordingly, arrangement of the external terminals 90 can be changed by patterning of the rear side wiring pattern without changing the other elements shown in FIG. 9. It should also be noted that this same modification could also be made to the first and/or second exemplary embodiments 10, 11.

In addition, the processes of forming the rear side insulating film 130, the rear side wiring pattern 140 and so on may be performed using any suitable method known in the art in the same way as those of forming the interlayer insulating film and the chip wiring at the side of the first main surface 20a.

In addition, for the above-described embodiments, the metal film 80, the wiring layers, the peripheral wiring, the conductive plugs, the peripheral plug, and any other conductive features, may be formed from copper or a copper alloy using, for example, a damascene process known in the art.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A semiconductor device comprising:
    a semiconductor substrate having a dicing region circumscribing a chip region, the chip region including a central region and a peripheral region around the central region;
    an active electrical structure formed to extend from a first main surface to a second surface vertically spaced apart from the first main surface in the central region of the semiconductor substrate;
    a through dummy isolation structure formed within the peripheral region to extend from the first main surface of the semiconductor substrate to a third surface vertically spaced apart from the first main surface of the semiconductor substrate, the through dummy isolation structure surrounding the active electrical structure;
    an insulating layer disbursed throughout the active electrical structure within the central region and around the through dummy isolation structure of the peripheral region, the insulating layer including top and opposed peripheral sides; and
    a metal film located over the top and peripheral sides of the insulating layer and over the semiconductor substrate, where the metal film is connected with the through dummy insulation structure.

2. The semiconductor device according to claim 1,
    further comprising an impurity diffusing layer formed within the semiconductor substrate in the peripheral region,
    wherein the through dummy isolation structure contacts the impurity diffusing layer.

3. The semiconductor device according to claim 1,
    wherein a peripheral oxide film formed within the semiconductor substrate surrounds the central region, the peripheral oxide film extending from the first main surface to a second main surface of the semiconductor device.

4. The semiconductor device according to claim 1,
    wherein the peripheral region includes, a first region adjacent to the central region and a second region surrounding the first region,
    further comprising an impurity diffusing layer formed within the semiconductor substrate in the first region,
    wherein the through dummy isolation structure contacts the impurity diffusing layer, and
    wherein a peripheral oxide film is formed within the semiconductor substrate in the second region, the peripheral oxide film extending from the first main surface to a second main surface of the semiconductor device.

5. The semiconductor device according to claim 3,
    further comprising a peripheral through electrode formed in the peripheral oxide film, the peripheral through electrode extending from the first main surface to the second main surface,
    wherein the through dummy isolation structure contacts the peripheral through electrode.

6. The semiconductor device according to any one of claims 1, wherein a thickness of the semiconductor substrate is no greater than 10 μm.

7. The semiconductor device according to any one of claims 1, further comprising:
    a rear side insulating film formed on a second main surface of the semiconductor device, opposite the first main surface;
    an external terminal in contact with an electrode extending through the semiconductor substrate and in contact with the active electrical structure; and
    a rear side wiring formed in the central region of the rear side insulating film and electrically connecting the external terminal to an electrode extending through the semiconductor substrate and in contact with the active electrical structure.

8. The semiconductor device according to any one of claims 1, further comprising:
    a rear side insulating film formed over a second main surface of the semiconductor device, opposite the first main surface; and
    an external terminal in contact with an electrode extending through the semiconductor substrate and in contact with the active electrical structure.

* * * * *